(12) United States Patent
Tanaka et al.

(10) Patent No.: US 8,567,313 B2
(45) Date of Patent: Oct. 29, 2013

(54) SCREEN PRINTING APPARATUS AND SCREEN PAINTING METHOD

(75) Inventors: Tetsuya Tanaka, Fukuoka (JP); Seiichi Miyahara, Saga (JP)

(73) Assignee: Panasonic Corporation, Osaka (JP)

( * ) Notice: Subject to any disclaimer, the term of this patent is extended or adjusted under 35 U.S.C. 154(b) by 78 days.

(21) Appl. No.: 13/170,537

(22) Filed: Jun. 28, 2011

(65) Prior Publication Data

US 2011/0252988 A1      Oct. 20, 2011

Related U.S. Application Data (63) Continuation of application No. 12/090,141, filed on Apr. 14, 2008, now abandoned.

(30) Foreign Application Priority Data

Dec. 13, 2005   (JP) .................................. 2005-358738

(51) Int. Cl.
*B41M 1/12*         (2006.01)
*B05C 17/06*        (2006.01)

(52) U.S. Cl.
USPC ............................ 101/129; 101/123; 101/126

(58) Field of Classification Search
USPC ........................... 101/114, 123, 124, 126, 129
See application file for complete search history.

(56) References Cited

U.S. PATENT DOCUMENTS

| | | |
|---|---|---|
| 3,631,796 A | 1/1972 | Hastings |
| 4,424,089 A | 1/1984 | Sullivan |
| 4,520,726 A | 6/1985 | Rouly et al. |
| 4,696,228 A | 9/1987 | David et al. |
| 4,854,229 A | 8/1989 | Vassiliou |
| 4,958,559 A | 9/1990 | Bubley et al. |

(Continued)

FOREIGN PATENT DOCUMENTS

JP            05-185580          7/1993

(Continued)

OTHER PUBLICATIONS

Machine English Translation of JP 05-185580, Jul. 1993.*

(Continued)

*Primary Examiner* — Ren Yan
(74) *Attorney, Agent, or Firm* — Pearne & Gordon LLP (57) ABSTRACT

To provide a screen printing apparatus and a screen printing method which can enhance a plate separating property after a printing operation regardless of a type of a mask, thereby suppressing occurrence of printing failure. A screen printing apparatus includes mask supporting means 6 for supporting a mask 2 from the rear surface thereof, holding means 20 for holding a printing medium 3, posture changing means 30 for changing a posture of the printing medium 3 held by the holding means 20 between a parallel posture parallel to the mask 2 and a tilted posture tilted about the mask 2, and lifting means for lifting the holding means 20 so as to contact and separate the surface of the printing medium 3 with or from the rear surface of the mask 2. Here, the printing medium 3 having been subjected to a pattern printing operation is separated from the mask 2 from one end of the printing medium to the other end thereof. Accordingly, it is possible to enhance a separating property between the printing medium 3 and the mask 2, thereby suppressing occurrence of printing failure.

18 Claims, 8 Drawing Sheets

(56) References Cited

U.S. PATENT DOCUMENTS

| | | |
|---|---|---|
| 6,192,794 B1 | 2/2001 | DeCruz |
| 6,354,199 B2 | 3/2002 | Murakami |
| 6,868,780 B2 | 3/2005 | Otake et al. |
| 2004/0079244 A1 | 4/2004 | Yamasaki et al. |

FOREIGN PATENT DOCUMENTS

| | | |
|---|---|---|
| JP | 08-244203 | 9/1996 |
| JP | 09-314802 | 12/1997 |
| JP | 11-042759 | 2/1999 |
| JP | 2005-047066 | 2/2005 |
| WO | 88/09727 | 12/1988 |

OTHER PUBLICATIONS

International Search Report for PCT/JP2006/325136 dated Mar. 19, 2007.

* cited by examiner

SCREEN PRINTING APPARATUS AND SCREEN PAINTING METHOD

This application is a continuation of U.S. patent application Ser. No. 12/090,141 filed Apr. 14, 2008, which is incorporated herein by reference in its entirety.

TECHNICAL FIELD

The present invention relates to a screen-printing apparatus and a screen-printing method in which a pattern of paste is printed on the surface of a printing medium positioned with respect to a mask having pattern holes.

BACKGROUND ART

In a screen printing operation of allowing a conductive material in a paste phase (conductive paste: hereinafter, simply referred to as "paste") to stay in pattern holes formed in a mask and printing a pattern on the surface of a printing medium, the paste remains in the pattern holes at the time of separating the printing medium from the mask after printing and thus the amount of paste printed on the surface of the printing medium becomes lack, thereby causing printing failure. In the past, in order to better pull the paste out of the pattern holes, there have been suggested a method of separating the mask and the printing medium from each other at a very low speed (see Patent Document 1 and Patent Document 2) and a method of performing a plate separating operation in a state where an end of the mask is allowed to move more upward than the other end and a plate separation angle of the mask about the printing medium is kept constant (see Patent Document 3).

[Patent Document 1] Japanese Unexamined Patent Application Publication No. 5-185580
[Patent Document 2] Japanese Unexamined Patent Application Publication No. 8-244203
[Patent Document 3] Japanese Unexamined Patent Application Publication No. 9-314802

However, in the plate separation methods disclosed in Patent Documents 1 and 2, a phenomenon of warping downwardly with the lowering of the printing medium occurs in the mask due to the adhesive force of paste. In addition, since the plate separation is started from an end of the printing medium and the center portion is finally separated, a high-speed plate separation is instantaneously caused at the center portion of the printing medium by an upward resilient restoring force acting on the mask and an operation of pulling out the paste is deteriorated, thereby easily causing printing failure. In the plate separation method disclosed in Patent Document 3, there is a problem in that it is necessary to add a moving mechanism to the mask and the plate separation method is not applicable to a printing apparatus employing a metal mask which has high rigidity and is not deformed easily.

DISCLOSURE OF INVENTION

Accordingly, an object of the invention is to provide a screen printing apparatus and a screen printing method which can enhance a plate separating property after a printing operation regardless of a type of a mask, thereby suppressing occurrence of printing failure.

According to an aspect of the invention, there is provided a screen printing apparatus for printing a pattern of paste on the surface of a printing medium which is positioned with respect to a mask having predetermined pattern holes therein, the screen printing apparatus comprising: mask supporting means for supporting the mask from the rear surface thereof; holding means for holding the printing medium; posture changing means for changing a posture of the printing medium held by the holding means between a parallel posture parallel to the mask and a tilted posture tilted about the mask; and lifting means for lifting the holding means so as to contact and separate the surface of the printing medium with or from the rear surface of the mask.

According to another aspect of the invention, there is provided a screen printing method of printing a pattern of paste on the surface of a printing medium which is positioned with respect to a mask having predetermined pattern holes therein, the screen printing apparatus comprising the steps of: bringing the surface of the printing medium into contact with the rear surface of the mask; printing a pattern on the surface of the printing medium; and separating the printing medium from the mask, wherein the step of separating the printing medium from the mask includes a step of tilting the printing medium about the mask.

According to the invention, by slowing separated the printing medium from the mask from one end of the printing medium to the other end thereof, it is possible to enhance a plate separating property between the printing medium and the mask, thereby suppressing occurrence of printing failure.

BRIEF DESCRIPTION OF THE DRAWINGS

FIG. 2($a$) is a plan view illustrating lifting means of the screen printing apparatus according to the first embodiment of the invention, FIG. 2($b$) is a side view illustrating the lifting means of the screen printing apparatus according to the first embodiment of the invention, and FIG. 2($c$) is a side view illustrating the lifting means of the screen printing apparatus according to the first embodiment of the invention.

FIG. 7($a$) is a plan view illustrating lifting means of a screen printing apparatus according to a second embodiment of the invention, FIG. 7($b$) is a side view illustrating the lifting means of the screen printing apparatus according to the second embodiment of the invention, and FIG. 7($c$) is a side view illustrating the lifting means of the screen printing apparatus according to the second embodiment of the invention.

FIG. 8($a$) is a plan view illustrating lifting means of a screen printing apparatus according to a third embodiment of the invention, FIG. 8($b$) is a side view illustrating the lifting means of the screen printing apparatus according to the third embodiment of the invention, and FIG. 8($c$) is a side view illustrating the lifting means of the screen printing apparatus according to the third embodiment of the invention.

BEST MODE FOR CARRYING OUT THE INVENTION (First Embodiment)

Figure 1:
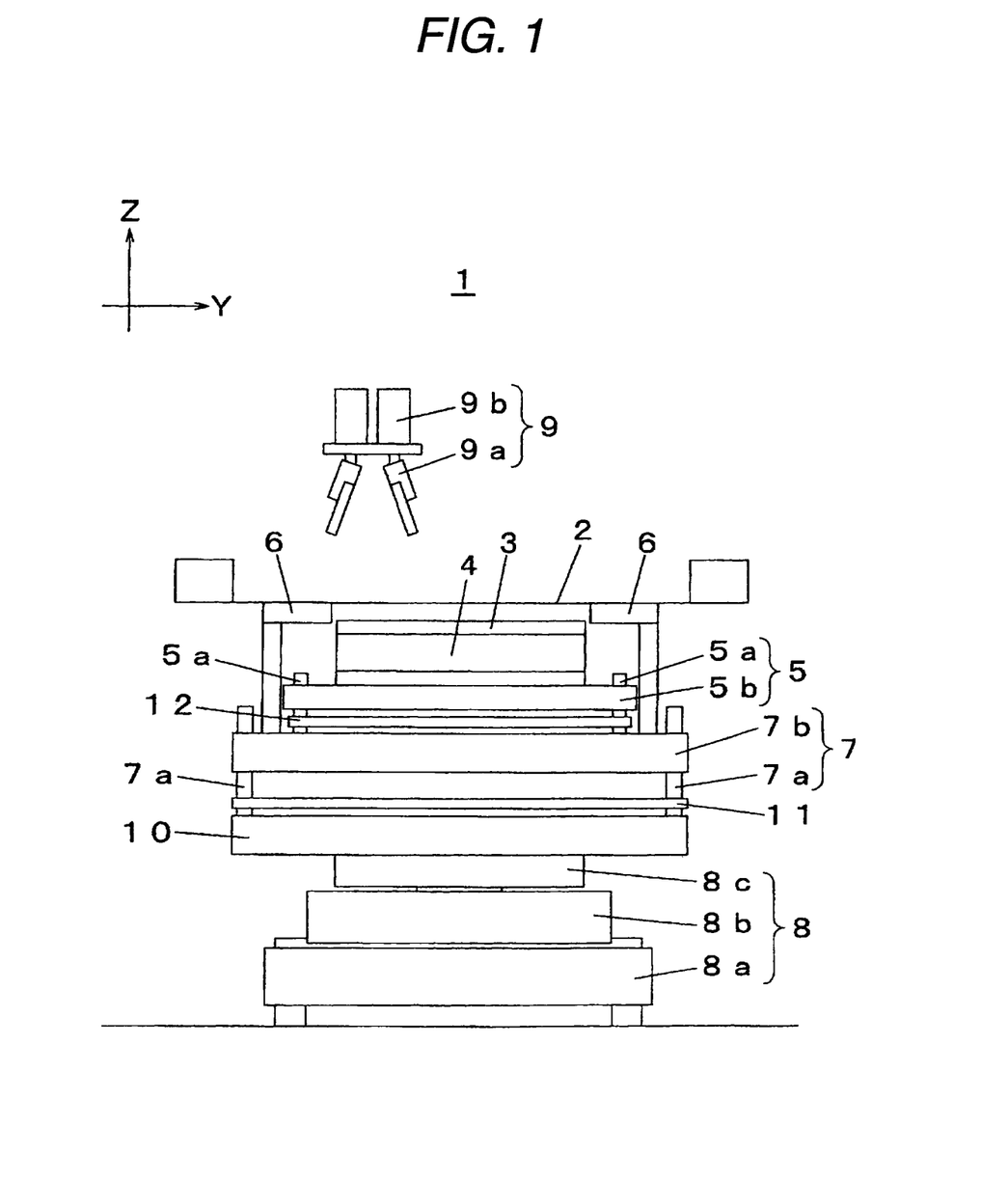
FIG. 1 is a front view of a screen printing apparatus according to a first embodiment of the invention.
Figure 2:
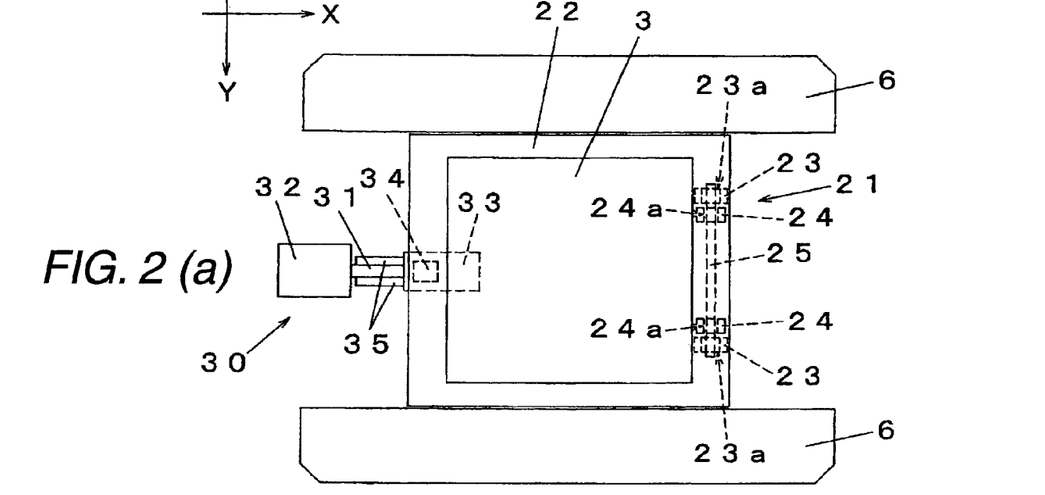
Figure 3:
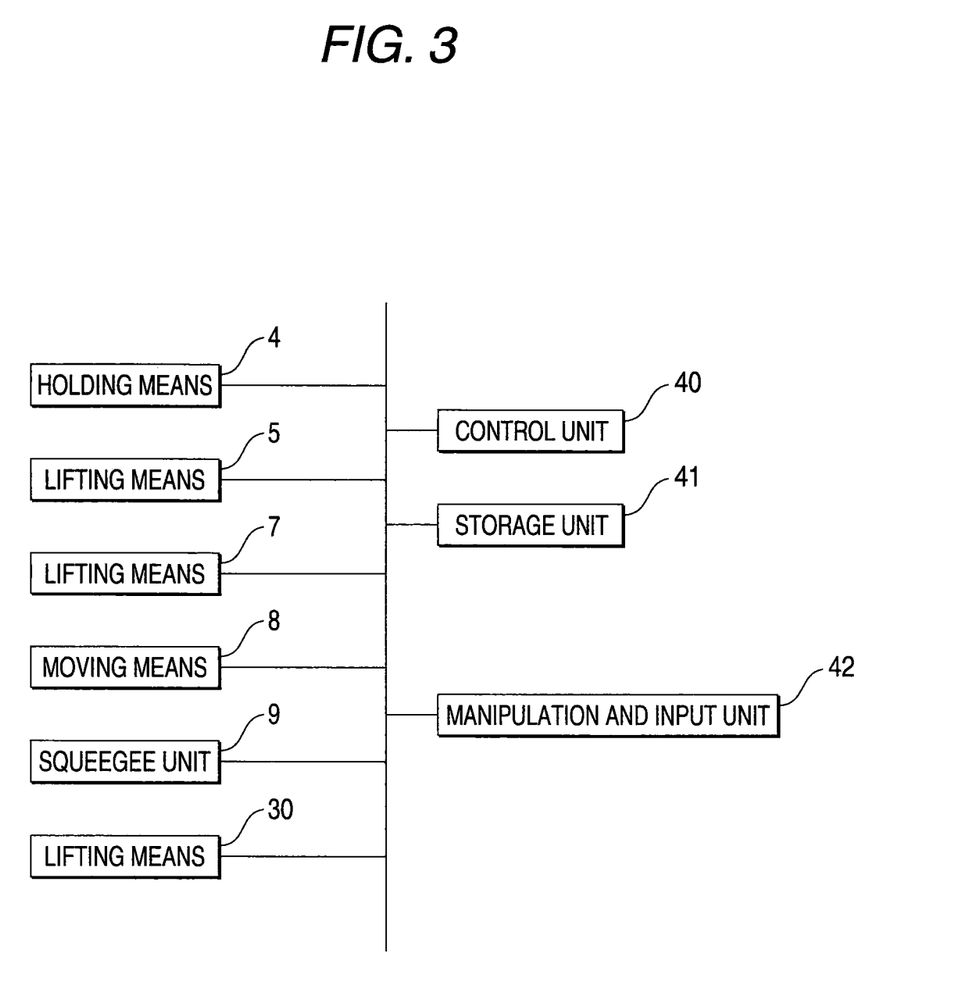
FIG. 3 is a diagram illustrating a configuration of the screen printing apparatus according to the first embodiment of the invention.
Figure 4:
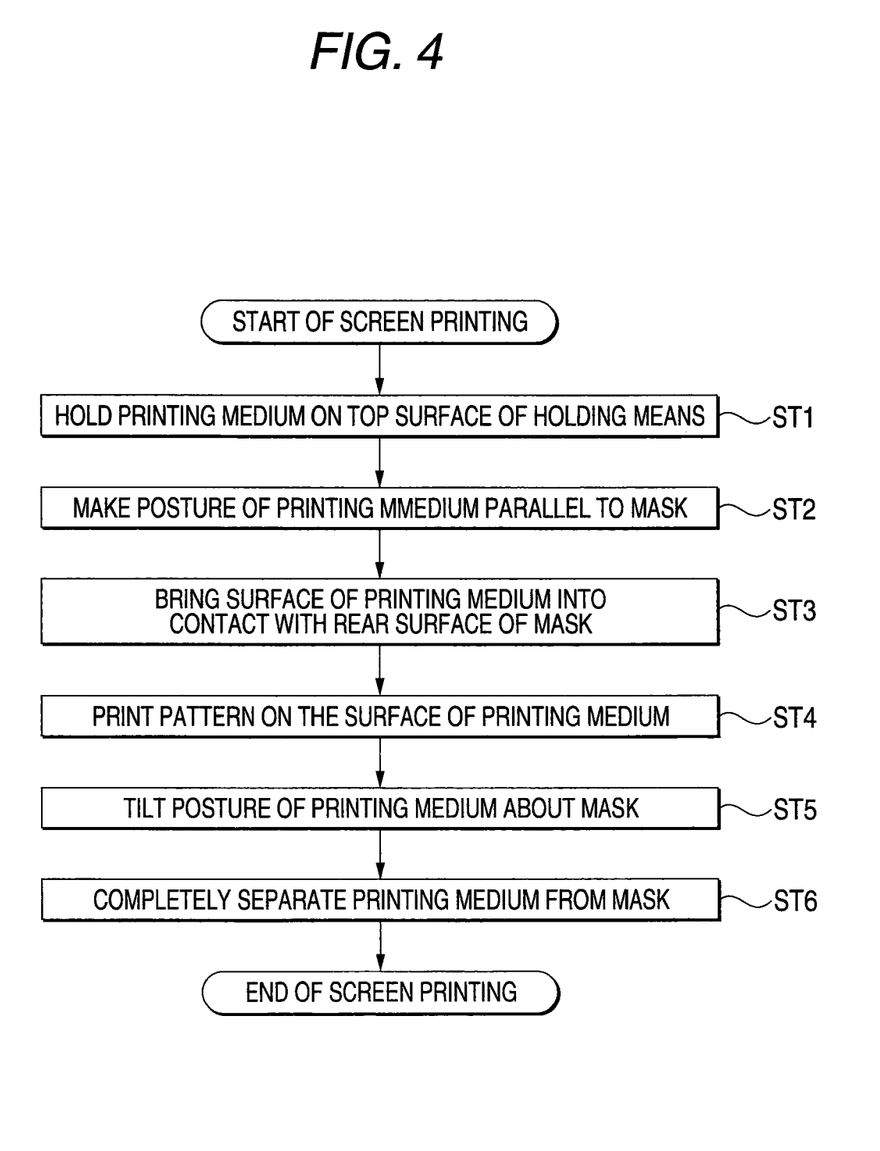
FIG. 4 is a flowchart illustrating a printing operation of the screen printing apparatus according to the first embodiment of the invention.
Figure 5:
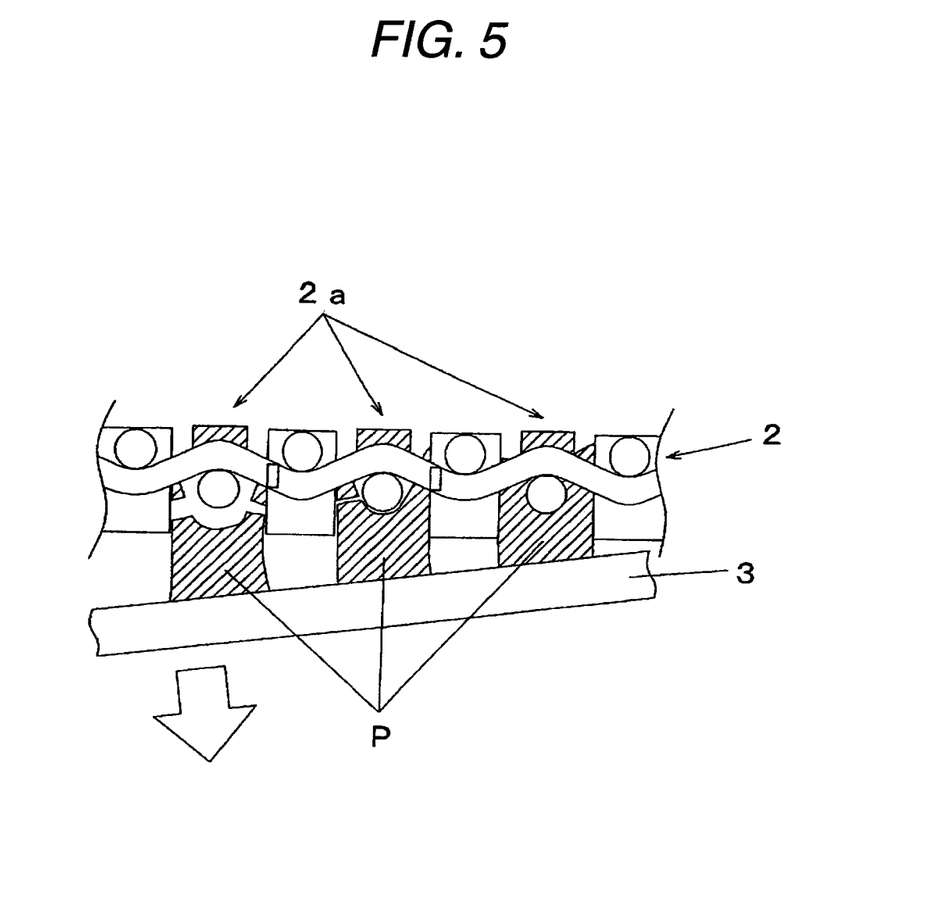
FIG. 5 is an explanatory diagram illustrating a plate separating state between a mask and a printing medium in the first embodiment of the invention.
Figure 6:
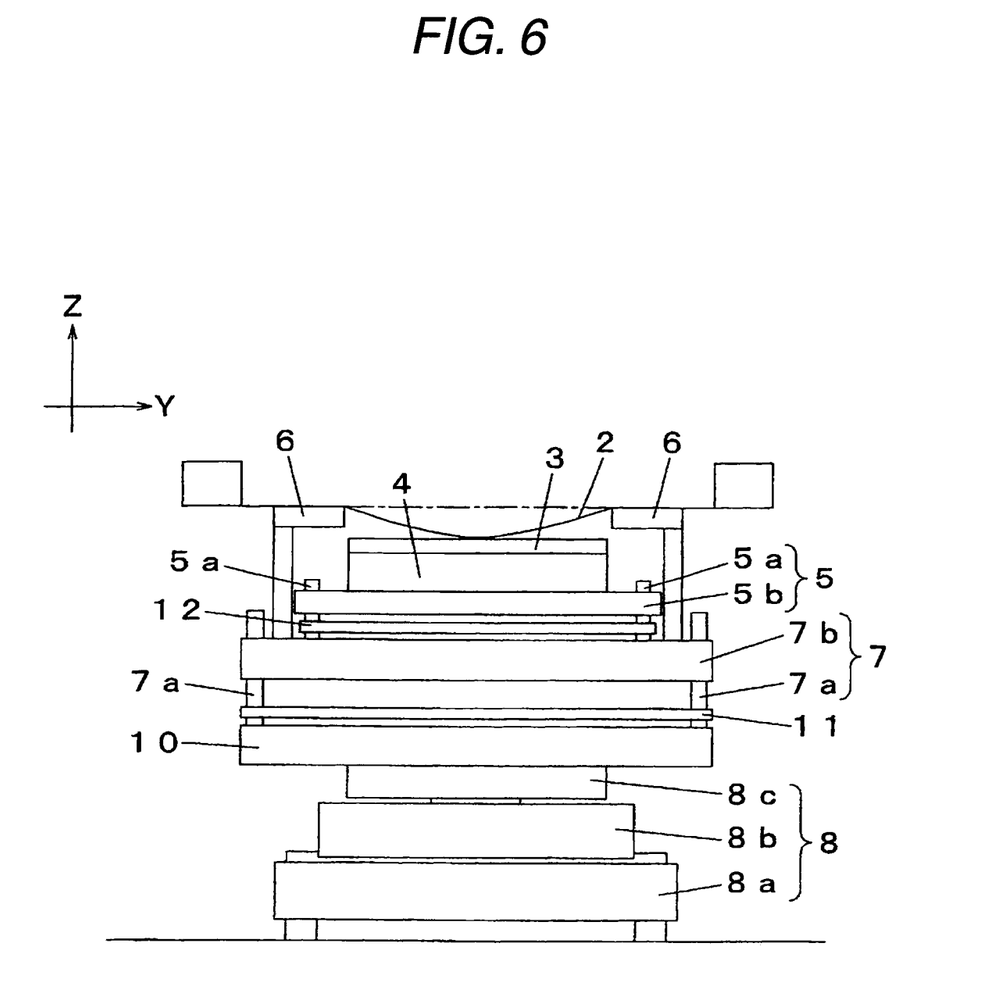
FIG. 6 is an explanatory diagram illustrating a plate separating state between a mask and a printing medium in the first embodiment of the invention.

A first embodiment of the invention will be described with reference to the drawings. FIG. 1 is a front view of a screen printing apparatus according to the first embodiment of the invention, FIG. 2(a) is a plan view illustrating lifting means according to the first embodiment of the invention, FIGS. 2(b) and 2(c) are side views illustrating the lifting means of the screen printing apparatus according to the first embodiment of the invention, FIG. 3 is a diagram illustrating a control system of the screen printing apparatus according to the first embodiment of the invention, FIG. 4 is a flowchart illustrating a printing operation of the screen printing apparatus according to the first embodiment of the invention, FIG. 5 is an explanatory diagram illustrating a state where a mask and a printing medium are separated from each other in the first embodiment of the invention, and FIG. 6 is an explanatory diagram illustrating a state where the mask and the printing medium are separated in the first embodiment of the invention.

First, an entire configuration of the screen printing apparatus will be described. In FIG. 1, the screen printing apparatus 1 is a device for printing a pattern of paste on the surface of a printing medium 3 positioned with respect to a mask 2 having predetermined pattern holes 2a formed therein. The screen printing apparatus includes holding means 4 for holding a printing medium 3, lifting means 5 for lifting the holding means 4 so as to contact and separate the surface of the printing medium 3 with or from the rear surface of the mask 2, mask supporting means 6 for supporting the mask 2 from the rear surface thereof, lifting means 7 for lifting the mask supporting means 6 so as to contact and separate the mask supporting means 6 with or from the rear surface of the mask 2, moving means for horizontally the holding means 4 relative to the mask 2 so as to position the printing medium with respect to the mask 2, and a squeegee unit 9 for applying paste onto the surface of the mask 2 to print a pattern on the surface of the printing medium 3.

In FIG. 1, the moving means 8 has a structure that an X table 8a, an Y table 8b, and a θ table 8c are stacked. The lifting means 7 is disposed on a table 10 which is rectangular as viewed in a plan view and which is provided on the θ table 8c and includes four ball screws 7a which is disposed at four corners of the table 9 and of which a feed direction is vertical and a table 7b horizontally supported in a state where it is screwed to the four ball screws 7a at four corners. A timing belt 11 is wound on the four ball screws 7a so as to synchronize rotations of the ball screws 7a with each other. The table 7b is lifted with the rotations of the ball screws 7a in a state where the horizontal posture is maintained. The mask supporting means 6 is disposed on the table 7b and the mask supporting means 6 is lifted with the lifting action of the table 7b so as to contact with and separate from the rear surface of the mask 2 (FIG. 1 shows a state where the table 7b is raised and the mask supporting means 6 contacts with the rear surface of the mask 2).

In FIG. 1, the lifting means 5 includes four ball screws 5a which is disposed on the table 7b and of which a feed direction is vertical and a table 5b horizontally supported in a state where it is screwed to the four ball screws 5a at four corners. A timing belt 12 is wound on the four ball screws 5a so as to synchronize rotations of the ball screws 5a with each other. The table 5b is lifted with the rotations of the ball screws 7a in a state where the horizontal posture is maintained. The holding means 4 is disposed on the table 5b and the holding means 4 is also lifted with the lifting action of the table 5b. The printing medium 3 loaded into the screen printing apparatus 1 is held on the holding means 4 and the surface of the printing medium 3 is allowed to contact with and separate from the rear surface of the mask 2 with the lifting action of the table 5b (FIG. 1 shows a state where the table 5b is lowered and the surface of the printing medium 3 is separated from the rear surface of the mask 2). The mask supporting means 6 may be used as clamping means for clamping the printing medium 3 from the side in the state where the surface of the printing medium 3 is in contact with the rear surface of the mask 2.

In FIG. 1, the squeegee unit 9 includes a squeegee 9a and lifting means 9b for lifting the squeegee 9a. The squeegee unit 9 has a function of printing a pattern of paste on the surface of the printing medium 3. The squeegee 9a is lowered in the state where the surface of the printing medium 3 is in contact with the rear surface of the mask 2 and is moved horizontally in the state where the squeegee unit is in contact with the surface of the mask 2, thereby applying paste onto the surface of the mask 2. Then, by allowing the paste to stay in the pattern holes 2a and then separating the printing medium 3 from the mask 2, the pattern of paste corresponding to the pattern holes 2a is printed on the surface of the printing medium 3. The squeegee unit may be constructed as a sealed squeegee storing and sealing paste in the unit.

Next, the holding means 4 will be described. In FIG. 2(b), the holding means 4 is disposed on the table 5b of the lifting means 5. The holding means 4 includes a holding portion 20 which is a hollow case body is supported on the table 5b by lifting means 30 for lifting an end of the holding portion 20 and a support portion 21 for pivotally supporting the other end.

A plurality of holes 20a allowing the inside of the case body to communicate with the outside thereof is formed on the substantially entire surface of the holding portion 20. The inside of the case body is connected to a vacuum pump not shown, the inside of the case body is changed to a sucking state by activating the vacuum pump, the printing medium 3 is adsorbed and held by the top surface of the case body having holes 20a formed therein. When the printing medium 3 is a flexible substrate having a flexible sheet shape, the printing medium is held by the holding portion 20 in the state where it is placed on a carrier 22. The carrier 22 is formed of a porous material and the printing medium 3 is adsorbed and held by the top surface of the carrier 22.

In FIGS. 2(a) and 2(b), the supporting portion 21 is disposed at an end in a transport direction (X direction) of the printing medium 3. The supporting portion 21 is constructed so that support rods 25 pivotally support holes 23a and 24a formed in a bracket 23 disposed on the bottom surface of the holding portion 20 and a bracket 24 disposed on the tope surface of the table 5b, respectively. Accordingly, the holding portion 20 can rotate about the support rods 25.

In FIGS. 2(a) and 2(b), the lifting means 30 is disposed at an end (an end opposite to the end at which the supporting portion 21 is disposed) in the transport direction (X direction) of the printing medium 3. As shown in FIG. 2(c), the lifting means 30 has a function of posture changing means for allowing the holding portion 20 to rotate about the supporting portion 21 by lifting the other end in the transport direction (X direction) of the printing medium 3 and changing the posture of the printing medium 3 held by the holding portion 20 relative to the mask 2. The lifting means 30 according to the first embodiment lifts one end of the holding portion 20 to change the posture of the printing medium 3 by converting a horizontal (X direction) movement into a vertical (Z direction) movement by the use of a cam mechanism and includes a cylinder 32 allowing a shaft 21 to advance and retreat in the transport direction (X direction) of the printing medium 3 and a cam 33 disposed at the end of the shaft 31. The top surface of the cam 33 is inclined and is disposed opposite to a cam follower 34 disposed on the bottom surface of the holding portion 20 so as to support the end of the holding portion 20.

When the shaft 31 advances and retreats by activating the cylinder 32, the cam 33 is guided by a guide 35 disposed on the top surface of the table 5b in the X direction so as to change the relative position to the cam follower 34. As shown in FIG. 2(b), when a place where the inclined surface of the cam 33 is raised is located opposite to the cam follower 34, the holding portion 20 can be in a horizontal posture. Accordingly, the posture of the printing medium 3 held by the holding portion 20 is parallel to the mask 2. On the other hand, as shown in FIG. 2(c), when the place where the inclined surface of the cam 33 is lowered is located opposite to the cam follower 34, the holding means 20 can be in a tilted posture. Accordingly, the posture of the printing medium 3 held by the holding portion 20 is tilted relative to the mask 2. In this way, by adjusting the drive amount of the cylinder 32 so as to allow a place of the top surface of the cam 33 to be opposite to the cam follower 34, the tilt angle of the printing medium 3 relative to the mask 2 can be adjusted, thereby changing the posture of the printing medium 3 between a posture parallel to the mask 2 and a tilted posture relative to the mask.

Next, a configuration of a control system of the screen printing apparatus 1 will be described. In FIG. 3, the holding means 4, the lifting means 5, the lifting means 7, the moving means 8, the squeegee unit 9, and the lifting means 30 can communicate with the control unit 40, receives a control command transmitted from the control unit 40, and perform a predetermined operation. Data on the printing medium 3 is stored in a storage unit 41 and control programs for executing a printing operation corresponding to the type of the printing medium 3 are set therein. The data or control programs can be input to the storage unit 41 by a manipulation and input unit 42 and operations of the screen printing apparatus 1 can be manually manipulated by the use of the manipulation and input unit 42.

Next, a printing operation of the screen printing apparatus 1 will be described. In FIG. 4, the printing medium 3 loaded into the screen printing apparatus 1 is adsorbed and held on the top surface of the holding portion 20 (ST1). Next, by lifting one end of the holding portion 20, the posture of the printing medium 3 is changed to a posture parallel to the mask 2 (ST2). In loading the printing medium 3 in ST1, the holding means 20 may be adjusted in advance so as to be in the posture parallel to the mask 2. In this case, the operation of ST2 can be omitted.

When it is checked that the printing posture 3 is in the posture parallel to the mask 2, the surface of the printing medium 3 comes in contact with the rear surface of the mask 2 by lifting the holding portion 20 (ST3). Next, a pattern is printed by allowing the squeegee unit 9 to move in a direction perpendicular to the transport direction of the printing medium 3, applying paste onto the surface of the mask 2, and allowing the paste to stay in the pattern holes 2a (ST4). Since the printing medium 3 is in the posture parallel to the mask 2 in ST2, adhesion between the surface of the printing medium 3 and the rear surface of the mask 2 is enhanced at the time of printing. Accordingly, the paste staying in the pattern holes 2a is suppressed from entering a gap between the surface of the printing medium 3 and the rear surface of the mask 2 to deteriorate printing precision, thereby enhancing the printing quality.

When the pattern printing operation is finished, the printing medium 3 is separated from the mask by lowering the holding portion 20. At the time of separation, as shown in FIG. 2(c), the posture of the printing medium 3 is changed to a posture tilted relative to the mask 2 by lowering one end of the holding portion 20 (ST5). As shown in FIG. 5, since the printing medium 3 is slowly separated from the mask 2 from the one end to the other end in the course of changing the posture of the printing medium 3 to the tilted posture, the paste P staying in the pattern holes 2a can be smoothly pulled out, thereby reducing the amount of the paste P remaining in the pattern holes 2a. Accordingly, since the amount of paste printed in a pattern on the surface of the printing medium 3 is not lack, the printing failure is prevented from occurring, thereby enhancing the printing quality.

As shown in FIG. 6, at the time of separation of the printing medium 3, a downward warp occurs in a direction (Y direction) perpendicular to the transport direction (X direction) of the printing medium 3 in the mask 2 supported by the mask supporting means 6. Accordingly, the printing medium 3 is slowly separated from the mask 2 from both ends to the center in the Y direction, thereby enhancing the plate separation property in the Y direction. Therefore, as described above, by lifting one end in the transport direction (X direction) of the printing medium 3 and slowly separating the printing medium from the mask 2 from the one end in the X direction, the plate separation property in the X direction is also enhanced. Accordingly, an excellent plate separation property of the entire surface of the printing medium 3 from the mask 2 can be accomplished, thereby further enhancing the printing quality. At the time of separation of the printing medium 3, by bringing the squeegee 9a into contact with the surface of the mask 2 located on the mask supporting means 6 and interposing and surely holding the mask 2 between the squeegee 9a and the mask supporting means 6, it is possible to more excellently perform the plate separation.

When the posture changing of the printing medium 3 is finished, the printing medium 3 is completely separated from the mask 2 by lowering the holding portion 20 (ST6). At this time, as shown in FIG. 5, since the paste P is not completely pulled out from the pattern holes 2a at the other end of the printing medium 3, the paste P can be smoothly pulled out at the other end side of the printing medium 3 by lowering the separation speed right after the start of lowering, thereby enhancing the plate separation property.

A mask such a metal mask which cannot be easily bent or a mask such as a resin mask which can be easily bent can be used as the mask 2 and thus a different occurs in the amount of bending of the mask at the time of the plate separation. Accordingly, the change of posture in ST5 and the lowering operation in ST6 cannot be necessarily performed in this order, but excellent plate separation can be performed regardless of the type of the mask 2 by properly combining both operations.

(Second Embodiment)

Next, a second embodiment of the invention will be described. The lifting means as the posture changing means of the screen printing apparatus 1 according to the second embodiment is different from the lifting means 30 according to the first embodiment. Hereinafter, the lifting means 50 according to the second embodiment will be described. The same elements as those of the first embodiment are denoted by the same reference numerals and detailed description thereof will be omitted.

Figure 7:
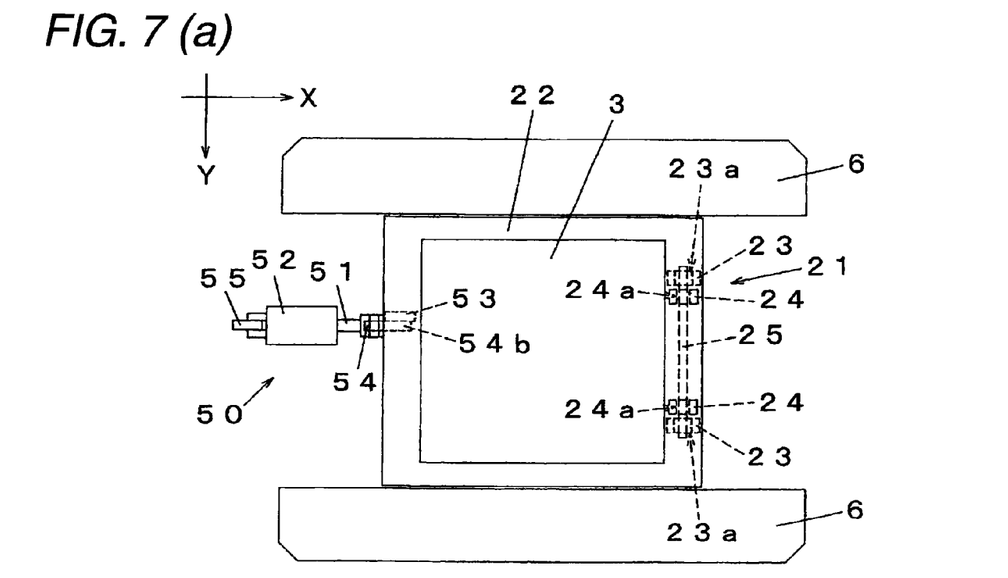

FIG. 7(a) is a plan view illustrating the lifting means of the screen printing apparatus according to the second embodiment of the invention and FIGS. 7(b) and 7(c) are side views illustrating the lifting means of the screen printing apparatus according to the second embodiment of the invention. In FIGS. 7(a) and 7(b), the lifting means 50 is disposed at one end in the transport direction (X direction) of the printing medium 3. As shown in FIG. 7(c), the lifting means 50 has a function of posture changing means for allowing the holding portion 20 to rotate about the supporting portion 21 by lifting one end in the transport direction (X direction) of the printing medium 3 and changing the posture of the printing medium 3 held by the holding portion 20 relative to the mask 2. The lifting means 50 according to the second embodiment lifts one end of the holding portion 20 to change the posture of the printing medium 3 by converting a horizontal (X direction) movement into a vertical (Z direction) movement by the use of a link mechanism and includes a cylinder 52 allowing a shaft 51 to advance and retreat in the transport direction (X direction) of the printing medium 3 and a hook member 54 connecting the end of the shaft 51 to a bracket 53 disposed on the bottom surface of the holding portion 20. One end 54a of the hook member 54 is pivotally attached to the end of the shaft 51 and the other end 54b thereof is pivotally attached to the bracket 53 disposed on the bottom surface of the holding means 20.

As shown in FIG. 7(b), when the shaft 51 is expanded, the holding means can be in a horizontal posture. Accordingly, the posture of the printing medium 3 held by the holding means 20 becomes parallel to the mask 2. On the other hand, as shown in FIG. 7(c), when the shaft 51 is contracted, the holding means 20 can be in a tilted posture. Accordingly, the posture of the printing medium 3 held by the holding portion 20 becomes tilted relative to the mask 2. When the shaft 51 is contracted, the one end 54a of the hook member 54 and the end of the pivotally attached shaft 51 slightly move upward. Accordingly, the cylinder 52 is pivotally attached to the bracket 55 disposed on the top surface of the table 5b to permit the vertical movement of the shaft 51.

(Third Embodiment)

Next, a third embodiment of the invention will be described. The lifting means as the posture changing means of the screen printing apparatus 1 according to the third embodiment is different from the lifting means 30 according to the first embodiment and the lifting means 50 according to the second embodiment. Hereinafter, the lifting means 60 according to the third embodiment will be described. The same elements as those of the first embodiment are denoted by the same reference numerals and detailed description thereof will be omitted.

Figure 8:
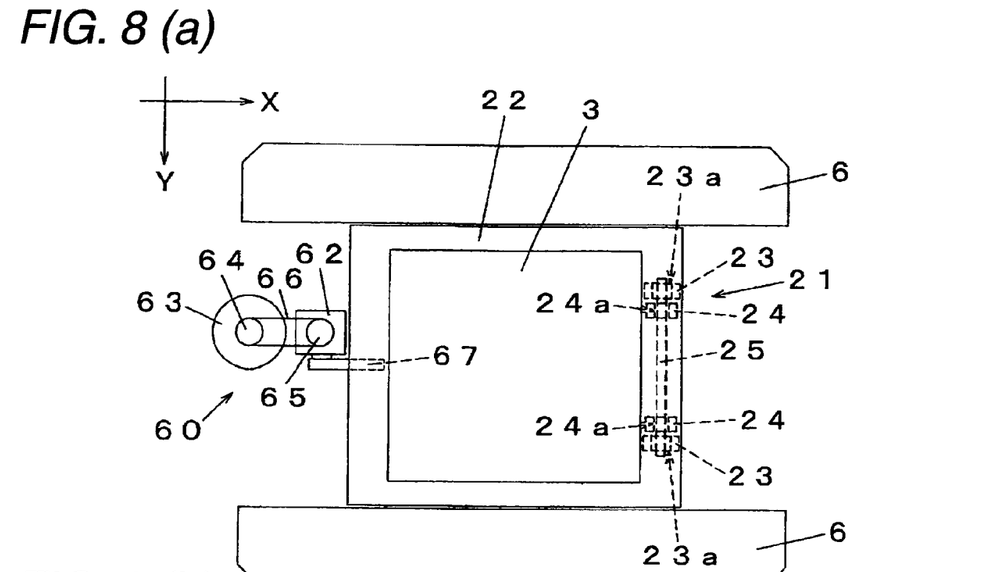

FIG. 8(a) is a plan view illustrating the lifting means of the screen printing apparatus according to the third embodiment of the invention and FIGS. 8(b) and 8(c) are side views illustrating the lifting means of the screen printing apparatus according to the third embodiment of the invention. In FIGS. 8(a) and 8(b), the lifting means 60 is disposed at one end in the transport direction (X direction) of the printing medium 3. As shown in FIG. 8(c), the lifting means 60 has a function of posture changing means for allowing the holding portion 20 to rotate about the supporting portion 21 by lifting one end in the transport direction (X direction) of the printing medium 3 and changing the posture of the printing medium 3 held by the holding portion 20 relative to the mask 2.

The lifting means 60 according to the third embodiment is constructed to allow one end 20b of the holding portion 20 to change the posture of the printing medium 3 by converting a movement of rotating about the vertical direction (Z direction) into a vertical (Z direction) movement and includes a ball screw 61 rising vertically (in the Z direction), a nut member 62 screwed to the ball screw 61, and a motor 63 as driving means for rotating the ball screw 61. The rotary power of the motor 63 is delivered to rotate the ball screw 61 through a belt 66 wound on a pulley 64 disposed on a rotation shaft 63a of the motor 53 and a pulley 65 disposed on the ball screw 61, the nut member 62 advances in the vertical direction so as to be lifted. A cam groove 62a is formed in the side of the nut member 62 and a roller 67a of the cam follower 67 disposed on the bottom surface of the holding portion 20 is fitted to the cam groove 62a. Accordingly, the one end 20b of the holding portion 20 is lifted with the lifting of the nut member 62.

As shown in FIG. 8(b), when the nut member 62 is allowed to advance above the ball screw 61, the holding portion 20 can be in the horizontal posture. Accordingly, the posture of the printing medium 3 held by the holding portion 20 becomes parallel to the mask 2. On the other hand, as shown in FIG. 8(c), when the nut member 62 is allowed to advance below the ball screw 61, the holding portion 20 can be in the tilted posture. Accordingly, the posture of the printing medium 3 held by the holding portion 20 becomes tilted relative to the mask 2.

In the first, second, and third embodiments of the invention, the lifting means for lifting one end of the holding means for holding the printing medium and the supporting portion for pivotally supporting the other end are disposed at the ends in the transport direction (X direction) of the printing medium. However, the lifting means and the supporting portion may be disposed in the direction (Y direction) perpendicular to the transport direction of the printing medium. In this case, since the printing medium is slowly separated from the mask from the one end to the other end, the paste P staying in the pattern holes can be smoothly pulled out, thereby reducing the amount of the paste P remaining in the pattern holes. Accordingly, the lack in paste patterned on the surface of the printing medium is prevented and the occurrence of printing failure is suppressed, thereby enhancing the printing quality.

This application is based upon and claims the benefit of priority of Japanese Patent Application No. 2005-358738 filed on Dec. 13, 2005, the contents of which are incorporated herein by reference in its entirety.

Industrial Applicability

According to the screen printing apparatus and the screen printing method of the invention, by slowly separating the printing medium from the mask from one end of the printing medium to the other end thereof, it is possible to enhance a separating property between the printing medium and the mask, thereby suppressing occurrence of printing failure. The screen printing apparatus and the screen printing method according to the invention are useful in the field of screen printing in which a pattern of paste is printed on the surface of a printing medium positioned with respect to the mask having pattern holes therein.

The invention claimed is:

1. A screen printing method of printing a pattern of paste on the surface of a printing medium which is positioned with respect to a mask having predetermined pattern holes therein, the screen printing method comprising the steps of:

holding the printing medium on a top surface of a holding means comprising a carrier formed of a porous material disposed on top of the holding means;

sucking through the porous material of the carrier the printing medium on the top surface of the carrier by vacuuming the carrier;

lifting at least two mask supporting means, the at least two mask supporting means being disposed horizontally at the same height, a side surface of each of the at least two mask supporting means being horizontally facing each other across the holding means;

supporting the mask by the at least two mask supporting means from the rear surface of the mask;

bringing whole surface of the printing medium into contact with the rear surface of the mask between the at least two mask supporting means in a posture parallel to the mask by lifting the holding means after ensuring the posture of the printing medium is parallel to the rear surface of the mask, the holding means holding the printing medium;

printing a pattern on the surface of the printing medium;

changing the posture of the printing medium into a posture tilted relative to the mask so as to separate a part of the printing medium from the mask; and separating the printing medium completely from the mask by lowering the holding means such that lowering speed is set to be slower when the holding means starts lowering than when the holding means is on its way down.

2. The screen printing method according to claim 1, wherein in the step of separating the printing medium completely from the mask, the holding means is lowered with slow separation speed right after start of lowering.

3. The screen printing method according to claim 1, wherein the holding means is lifted by rotating at least four first ball screws screwed to a first table, and the holding means is disposed on the first table.

4. The screen printing method according to claim 3, wherein the at least two mask supporting means are disposed on a second table disposed under the first table and the at least two mask supporting means are lifted or lowered in a state that the horizontal posture of the at least two mask supporting means is maintained by lifting or lowering action of a lifting means comprising the second table and at least four second ball screws.

5. The screen printing method according to claim 1, wherein each of the at least two mask supporting means has a substantially rectangular shape, the longitudinal side of the each of the at least two mask supporting means is parallel to a transport direction of the printing medium, and the changing posture of the printing medium is performed by lowering one side of the holding means in the transport direction of the printing medium.

6. The screen printing method according to claim 1, wherein the side surface of each of the at least two mask supporting means are facing each other in a direction perpendicular to the transport direction of the printing medium.

7. The screen printing method according to claim 1, wherein the at least two mask supporting means are supported and lifted by a lifting means.

8. The screen printing method according to claim 1, wherein the at least two mask supporting means are disposed on a table and the at least two mask supporting means are lifted or lowered in a state that the horizontal posture of the at least two mask supporting means is maintained by lifting or lowering action of a lifting means comprising the table and at least four ball screws.

9. The screen printing method according to claim 1, further comprising a step of cramping the printing medium from the side of the printing medium by the at least two mask supporting means after bringing the whole surface of the printing medium into contact with the rear surface of the mask in the posture parallel to the mask.

10. The screen printing method according to claim 1, further comprising a step of separating the at least two mask supporting means from the mask after separating the printing medium from the mask by lowering the holding means.

11. The screen printing method according to claim 1, wherein the separating the printing medium from the mask comprises separating the tilted printing medium completely from the mask by lowering the holding means holding the tilted printing medium such that lowering speed is set to be slower when the tilted printing medium is separated from the mask than when the holding means lowers after the separation.

12. The screen printing method according to claim 1, wherein at the end of the step of changing the posture of the printing medium into the posture tilted relative to the mask, the paste at the end of the tilted printing medium is not pulled out from the pattern holes, and the method comprises:

lowering the tilted printing medium;

pulling out the paste from the pattern holes at the end of the tilted printing medium; and then increasing the lowering speed after the paste at the end of the tilted printing medium is pulled out from the pattern holes.

13. A screen printing method of printing a pattern of paste on the surface of a printing medium which is positioned with respect to a mask having predetermined pattern holes therein, the screen printing method comprising the steps in the order of:

holding the printing medium on a top surface of a holding means comprising a carrier formed of a porous material disposed on top of the holding means;

sucking through the porous material of the carrier the printing medium on the top surface of the carrier by vacuuming the carrier;

lifting at least two mask supporting means, the at least two mask supporting means being disposed horizontally at the same height, a side surface of each of the at least two mask supporting means being horizontally facing each other across the holding means;

supporting the mask by the at least two mask supporting means from the rear surface of the mask;

ensuring a posture of the printing medium is parallel to the mask;

lifting a holding means in a state that the parallel posture of the printing medium to the mask is maintained, the holding means holding the printing medium;

bringing whole surface of the printing medium into contact with the rear surface of the mask between the at least two mask supporting means in the posture parallel to the mask;

printing a pattern on the surface of the printing medium;

changing the posture of the printing medium into a posture tilted relative to the mask so as to separate a part of the printing medium from the mask; and separating the printing medium completely from the mask by lowering the holding means such that lowering speed is set to be slower when the holding means starts lowering than when the holding means is on its way down.

14. The screen printing method according to claim 13, wherein at the end of the step of changing the posture of the printing medium into the posture tilted relative to the mask, the paste at the end of the tilted printing medium is not pulled out from the pattern holes, and the method comprises:

lowering the tilted printing medium;

pulling out the paste from the pattern holes at the end of the tilted printing medium; and then increasing the lowering speed after the paste at the end of the tilted printing medium is pulled out from the pattern holes.

15. A screen printing method of printing a pattern of paste on the surface of a printing medium which is positioned with respect to a mask having predetermined pattern holes therein, the screen printing method comprising the steps in the order of:

holding the printing medium on a top surface of a holding means comprising a carrier formed of a porous material disposed on top of the holding means;

sucking through the porous material of the carrier the printing medium on the top surface of the carrier by vacuuming the carrier;

lifting a holding means in a state that a horizontal posture of the printing medium is maintained, the holding means holding the printing medium;

bringing whole surface of the printing medium into contact with the rear surface of the mask in the posture parallel to the mask;

printing a pattern on the surface of the printing medium;

lowering a cam follower having a roller by rotating a ball screw having a cam groove so that the roller fitted to the cam groove of the ball screw is advanced down the cam groove, wherein the cam follower is disposed on the bottom surface of one end of the holding means, the ball screw does not move upward or downward while lowering the cam follower, and the holding means is disposed on a top surface of a first table;

changing the posture of the printing medium into a posture tilted relative to the mask so as to separate a part of the printing medium from the mask; and separating the printing medium completely from the mask by lowering the holding means such that lowering speed is set to be slower when the holding means starts lowering than when the holding means is on its way down.

16. The screen printing method according to claim 15, wherein the holding means is lifted after ensuring the posture of the printing medium is parallel to the rear surface of the mask.

17. The screen printing method according to claim 15, wherein the ball screw does not penetrate the first table.

18. The screen printing method according to claim 15, wherein at the end of the step of changing the posture of the printing medium into the posture tilted relative to the mask, the paste at the end of the tilted printing medium is not pulled out from the pattern holes, and the method comprises:

lowering the tilted printing medium;

pulling out the paste from the pattern holes at the end of the tilted printing medium; and then increasing the lowering speed after the paste at the end of the tilted printing medium is pulled out from the pattern holes.

* * * * *

UNITED STATES PATENT AND TRADEMARK OFFICE
CERTIFICATE OF CORRECTION

PATENT NO. : 8,567,313 B2  
APPLICATION NO. : 13/170537  
DATED : October 29, 2013  
INVENTOR(S) : Tetsuya Tanaka and Seiichi Miyahara

Page 1 of 1

It is certified that error appears in the above-identified patent and that said Letters Patent is hereby corrected as shown below:

On the Title page, item (63) Related U.S. Application Data should read as follows:

Continuation of application No. 12/090,141, filed as application No. PCT/JP2006/325136 on December 12, 2006, now abandoned.

Signed and Sealed this  
Fifteenth Day of April, 2014

Michelle K. Lee  
*Deputy Director of the United States Patent and Trademark Office*